United States Patent
Sato

(10) Patent No.: US 9,247,667 B2
(45) Date of Patent: Jan. 26, 2016

(54) ELECTRONIC DEVICE AND ELECTRONIC DEVICE UNIT

(71) Applicant: FUJITSU LIMITED, Kawasaki-shi, Kanagawa (JP)

(72) Inventor: Yoshiyuki Sato, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 43 days.

(21) Appl. No.: 14/444,233

(22) Filed: Jul. 28, 2014

(65) Prior Publication Data

US 2015/0055294 A1  Feb. 26, 2015

(30) Foreign Application Priority Data

Aug. 23, 2013 (JP) ................................. 2013-173995

(51) Int. Cl.
*H05K 7/14* (2006.01)
*G02B 6/44* (2006.01)

(52) U.S. Cl.
CPC ............ *H05K 7/1421* (2013.01); *G02B 6/4448* (2013.01); *G02B 6/4452* (2013.01)

(58) Field of Classification Search
CPC ..... H05K 7/14; H05K 7/1411; H05K 7/1421; H05K 7/1427; H05K 7/1488; H05K 7/18; H05K 7/183
USPC ............... 361/724, 725, 726, 727; 312/223.1, 312/223.2
See application file for complete search history.

(56) References Cited

U.S. PATENT DOCUMENTS

| | | | | |
|---|---|---|---|---|
| 6,578,939 B1* | 6/2003 | Mayer | ........ | A47B 88/044 312/334.5 |
| 6,661,667 B2* | 12/2003 | Robbins | ........ | G06F 1/183 312/223.2 |
| 6,856,505 B1* | 2/2005 | Venegas | ........ | G06F 1/1601 361/679.05 |
| 7,019,963 B2* | 3/2006 | Lee | ........ | G06F 1/16 211/26 |
| 7,675,742 B2* | 3/2010 | Wu | ........ | G06F 1/16 211/134 |
| 7,701,704 B2* | 4/2010 | Huang | ........ | G06F 1/187 361/679.36 |
| 7,857,145 B2* | 12/2010 | Mushan | ........ | A47B 88/044 211/26 |
| 8,104,626 B2* | 1/2012 | Huang | ........ | A47B 88/044 211/26 |
| 2001/0035704 A1* | 11/2001 | Dierbeck | ........ | A47B 88/0466 312/334.13 |
| 2002/0190613 A1* | 12/2002 | Liu | ........ | H05K 7/1421 312/223.2 |
| 2004/0120106 A1* | 6/2004 | Searby | ........ | G06F 1/181 361/679.58 |
| 2008/0062654 A1* | 3/2008 | Mattlin | ........ | G06F 1/181 361/727 |
| 2012/0155034 A1* | 6/2012 | Hsiao | ........ | H05K 7/1489 361/726 |

FOREIGN PATENT DOCUMENTS

JP       02-172297       7/1990

* cited by examiner

*Primary Examiner* — Anthony Haughton
(74) *Attorney, Agent, or Firm* — Staas & Halsey LLP

(57) ABSTRACT

An electronic device includes: a frame-body that has a rectangular-cross-section and includes: first and second inner-walls that oppose each other, third and fourth inner-walls that oppose each other and that intersect with the first and second inner-walls, first engagement-members arranged on the first inner-wall at a first interval, second engagement-members e arranged on the second inner-wall at the first interval so as to oppose the first engagement-members, the second engagement-members each having a structure that allows each of the second engagement-members to be engaged with a corresponding first engagement-member of the first engagement-members, third engagement-members arranged on the third inner-wall at a second interval, and fourth engagement-members arranged on the fourth inner-wall at the second interval so as to oppose the third engagement-members, the fourth engagement-members each having a structure that allows each of the fourth engagement-members to be engaged with a corresponding third engagement-member of the third engagement-members.

9 Claims, 16 Drawing Sheets

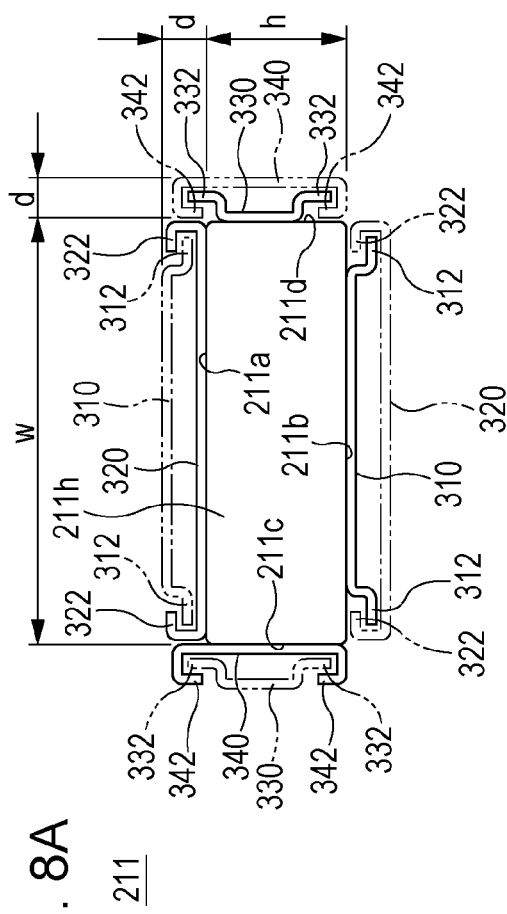
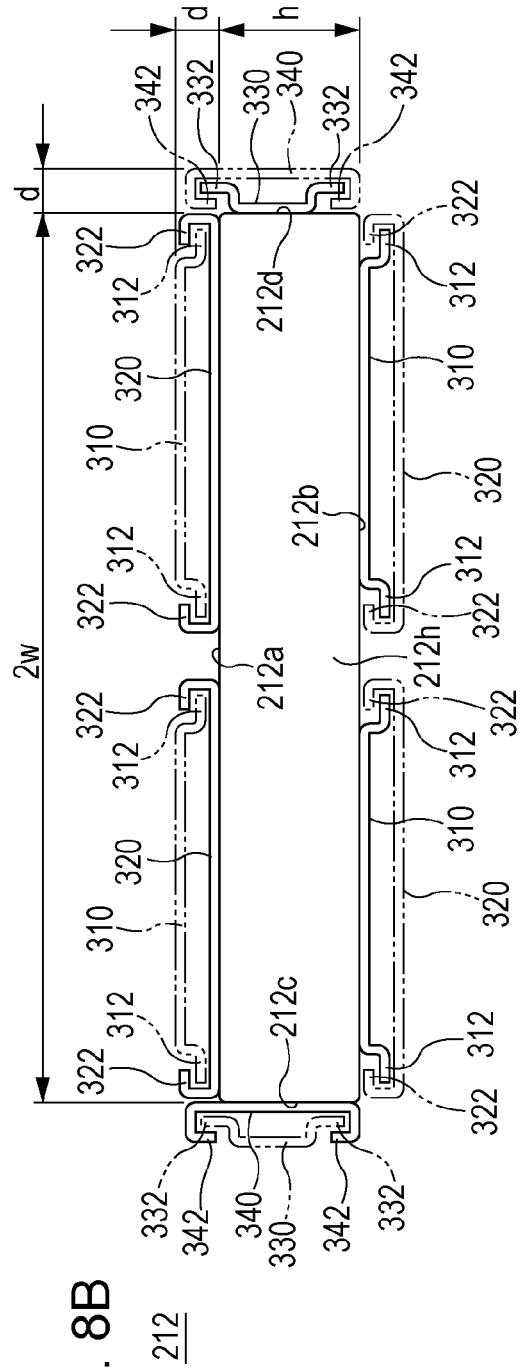
FIG. 8A
FIG. 8B

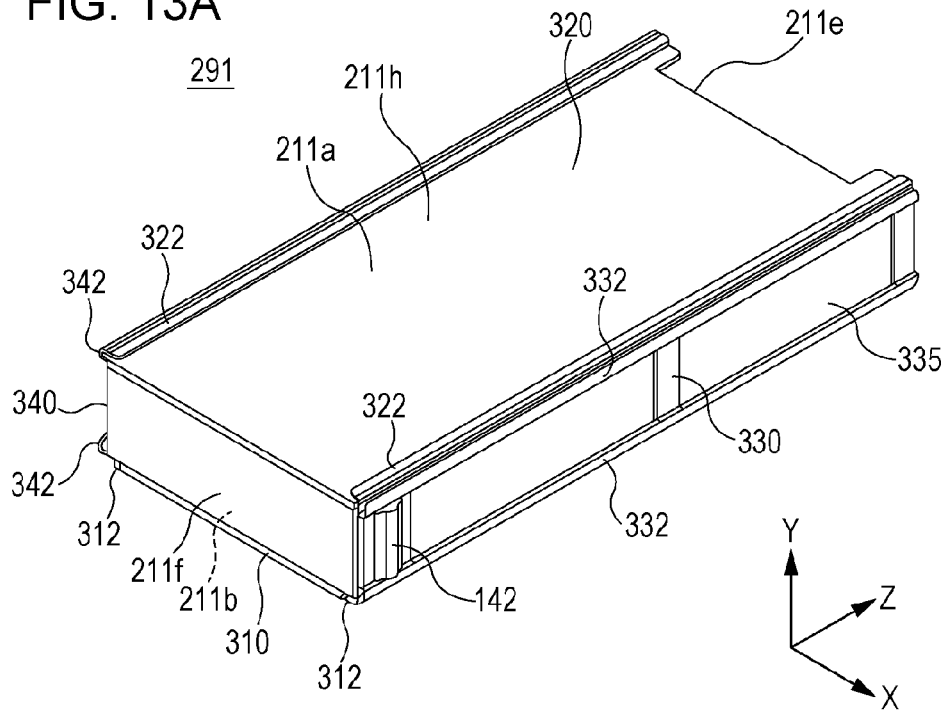
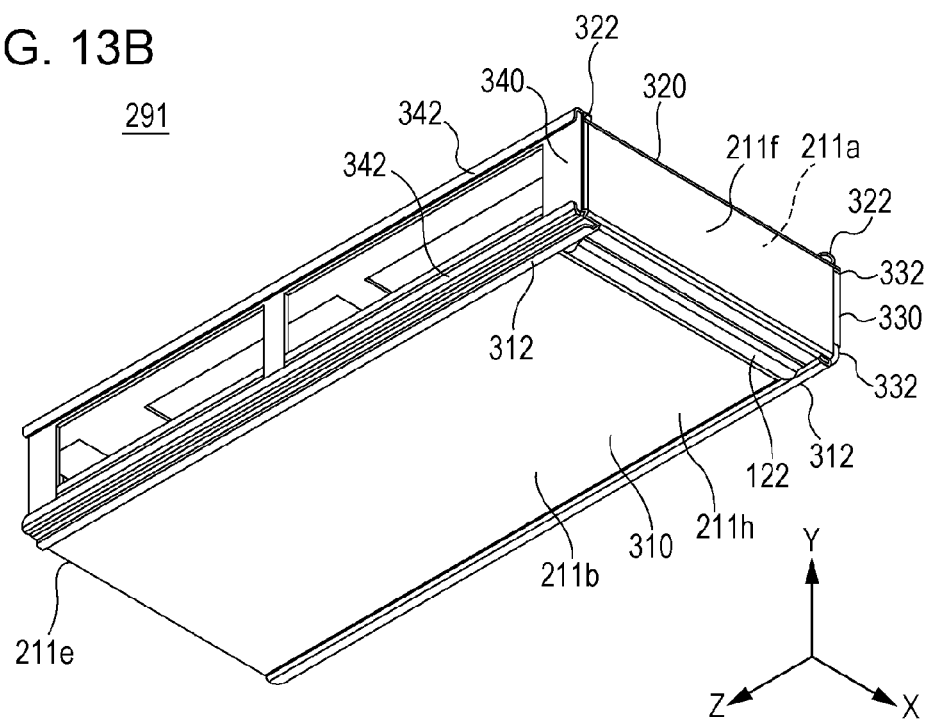

ELECTRONIC DEVICE AND ELECTRONIC DEVICE UNIT

CROSS-REFERENCE TO RELATED APPLICATION

This application is based upon and claims the benefit of priority of the prior Japanese Patent Application No. 2013-173995 filed on Aug. 23, 2013, the entire contents of which are incorporated herein by reference.

FIELD

The embodiment discussed herein is related to an electronic device and an electronic device unit.

BACKGROUND

In electronic devices, such as optical transmission devices, ones that mount a plurality of electronic device units, which mount electronic circuits such as an IC or an LSI and an optical module on a printed board, on a rack are used. Japanese Laid-open Patent Publication No. 02-172297 is a reference document.

It is preferable that operations such as replacing electronic device units of different sizes are easily carried out in such electronic devices.

SUMMARY

According to an aspect of the invention, an electronic device includes: a frame-body that has a rectangular-cross-section and includes: first and second inner-walls that oppose each other, third and fourth inner-walls that oppose each other and that intersect with the first and second inner-walls, first engagement-members arranged on the first inner-wall at a first interval, second engagement-members e arranged on the second inner-wall at the first interval so as to oppose the first engagement-members, the second engagement-members each having a structure that allows each of the second engagement-members to be engaged with a corresponding first engagement-member of the first engagement-members, third engagement-members arranged on the third inner-wall at a second interval, and fourth engagement-members arranged on the fourth inner-wall at the second interval so as to oppose the third engagement-members, the fourth engagement-members each having a structure that allows each of the fourth engagement-members to be engaged with a corresponding third engagement-member of the third engagement-members.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8A is a schematic front view of an h×w-sized printed board unit of the plug-in electronic device of the exemplary embodiment, and FIG. 8B is a schematic front view of an h×2w-sized printed board unit of the plug-in electronic device of the exemplary embodiment;

FIG. 13A is a schematic perspective view of an h×w-sized filler unit of the plug-in electronic device of the exemplary embodiment viewed from the upper right, and FIG. 13B is a schematic perspective view of the h×w-sized filler unit of the plug-in electronic device of the exemplary embodiment viewed from the lower left;

DESCRIPTION OF EMBODIMENT

Figure 1:
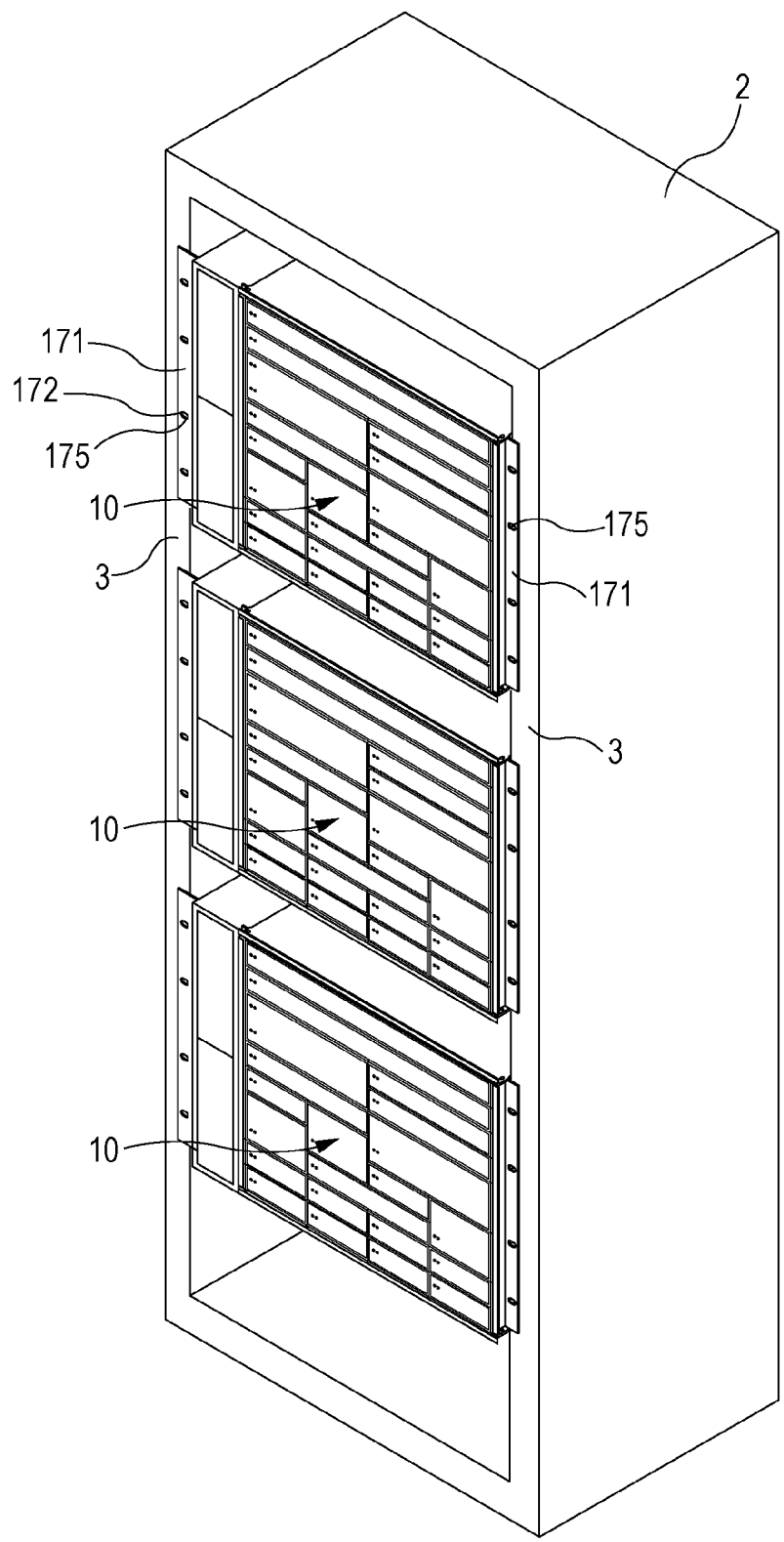
FIG. 1 is a schematic perspective view for illustrating a plurality of plug-in electronic devices of an exemplary embodiment mounted in a rack.

Referring to the drawings, a preferred embodiment according to a technique disclosed in the present application will be described next.

Referring to FIG. 1, a plurality of (three in the present case) plug-in electronic devices 10 of the preferred embodiment are mounted in a rack 2. The plug-in electronic devices 10 are each attached to left and right attaching portions 3 of the rack 2 with screws 175 inserted in holes 172 of left and right mounting brackets 171 of the plug-in electronic device 10. The plug-in electronic devices 10 are examples of the electronic device. When the plug-in electronic devices 10 are optical transmission devices or the like, the plug-in electronic devices 10 are mounted in the rack 2 in the above manner and are, for example, installed in a central telephone exchange.

Figure 2:
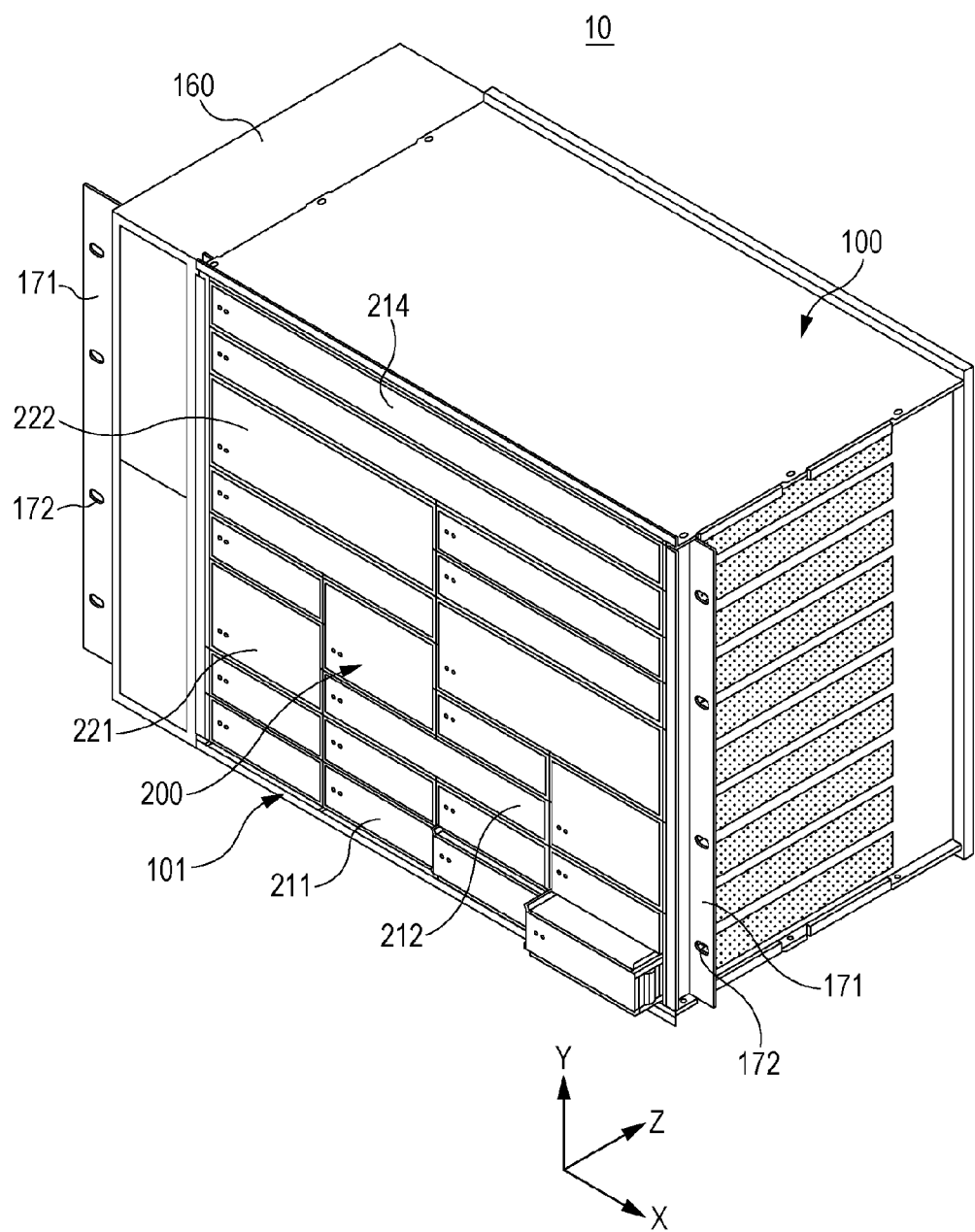
FIG. 2 is a schematic perspective view for illustrating the plug-in electronic devices of the exemplary embodiment.

Referring to FIG. 2, the plug-in electronic device 10 of the preferred embodiment includes a shelf 100 and a plurality of printed board units 200 that are mounted in the shelf 100. The shelf 100 is an example of a frame body, and the printed board units 200 are examples of the electronic device unit.

The printed board units 200 include different types of printed board units 211, 212, 221, 222, and 214 with different sizes. As regards the size of the printed board unit 211, the length of the printed board unit 211 in the height direction, which is the length of the printed board unit 211 in the Y direction, serves as a reference height h and the length of the printed board unit 211 in the width direction, which is the length of the printed board unit 211 in the X direction, serves as a reference width w (see FIG. 8A). Herein, the above size is referred to as an h×w size. The printed board unit 212 is formed so that its width is two times that of the reference width w. The printed board unit 212 is referred to as an h×2w-sized printed board unit. The printed board unit 221 is formed so that its height is two times that of the reference height h. The printed board unit 221 is referred to as a 2h×w-sized printed board unit. Similarly, the printed board unit 222 is referred to as a 2h×2w-sized printed board unit. The printed board unit 214 is referred to as an h×4w-sized printed board unit. Printed board units with different sizes, for example, a 4h×w-sized printed board unit 200, a 4h×4w-sized printed board unit 200, and the like may be employed. Note that the lengths of the printed board units 200 in the depth direction, which are the lengths in the Z direction, are all the same.

Figure 3:
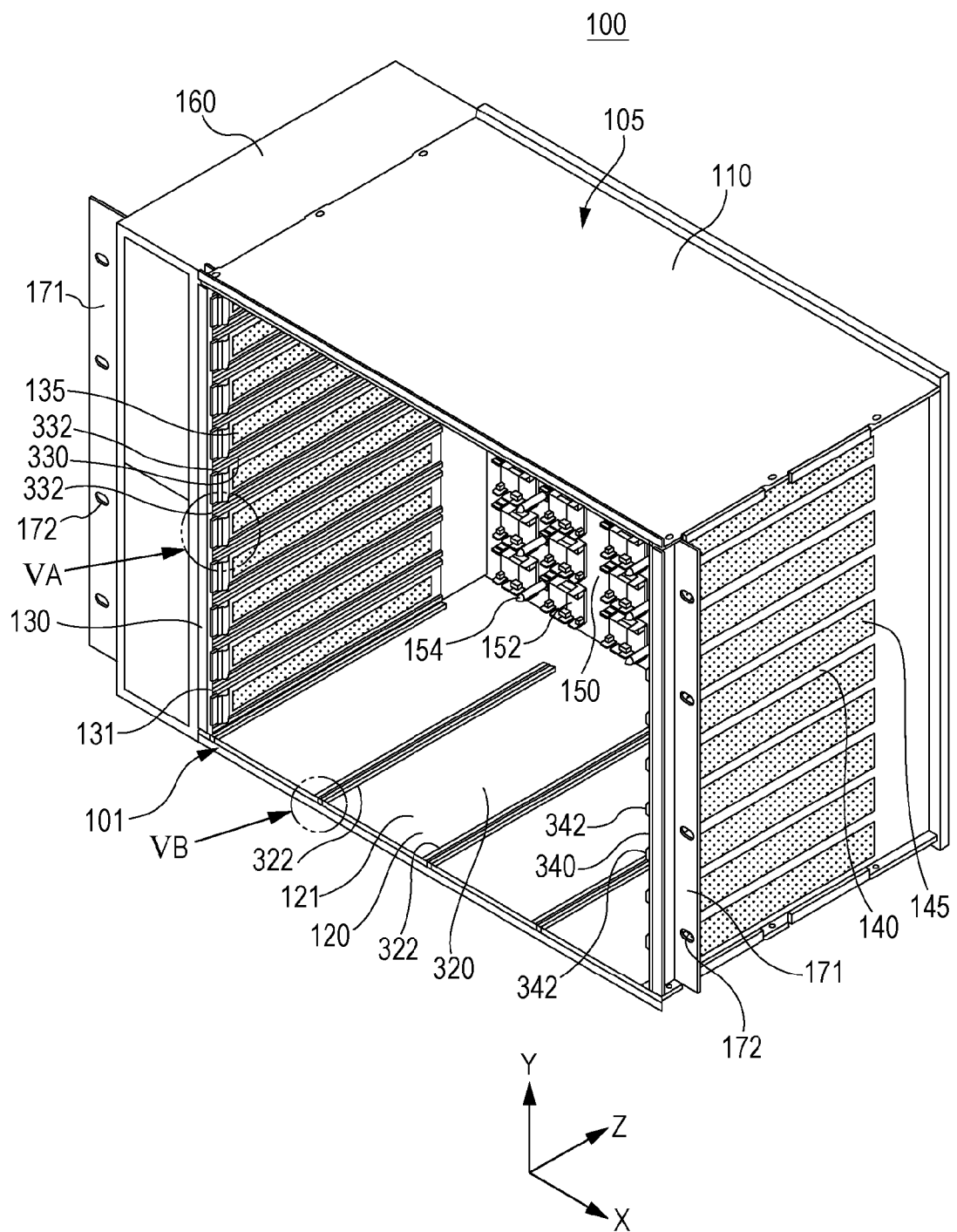
FIG. 3 is a schematic perspective view for illustrating a shelf of the plug-in electronic device of the exemplary embodiment viewed from the upper right of the shelf.
Figure 4:
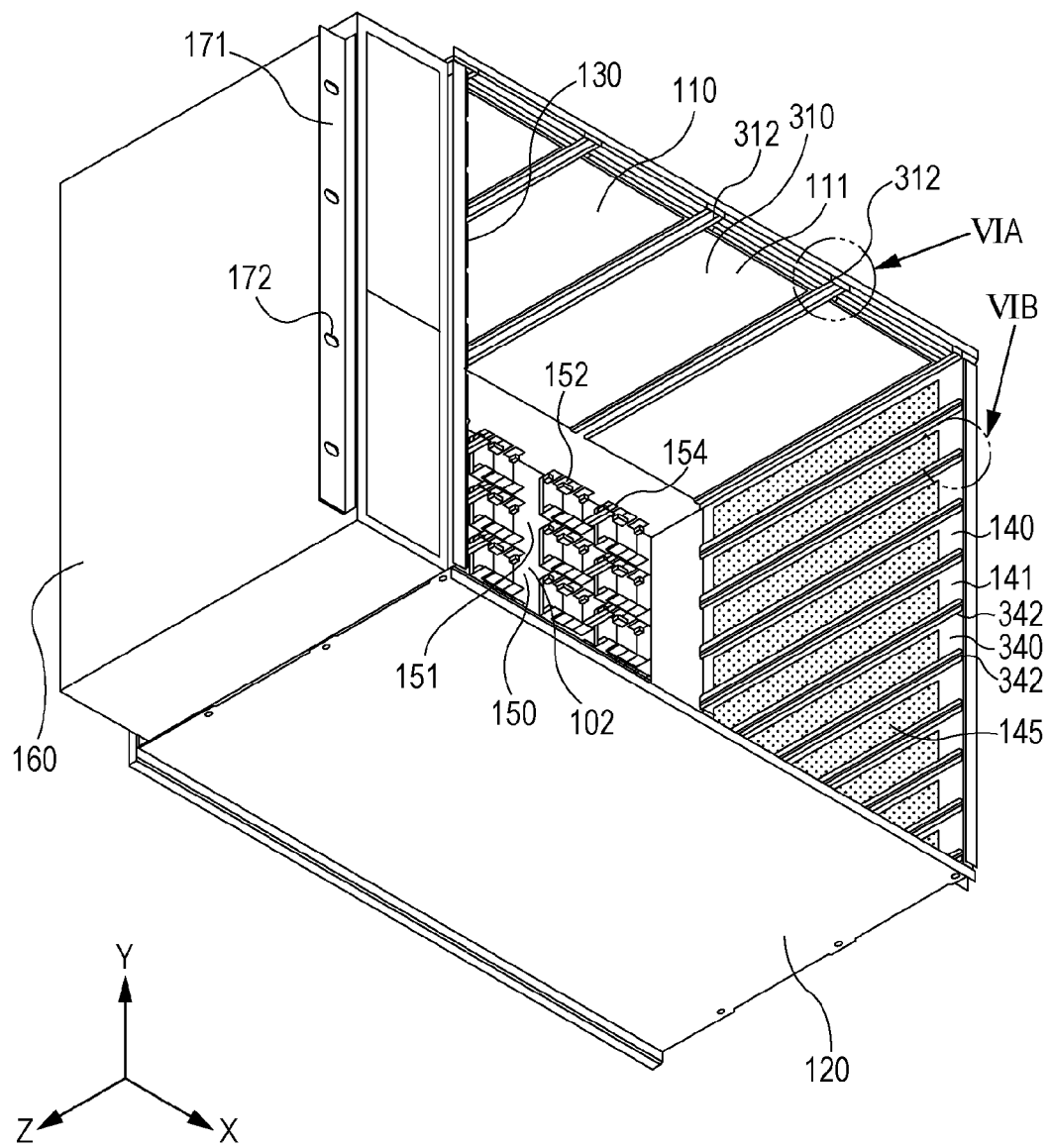
FIG. 4 is a schematic perspective view for illustrating the shelf of the plug-in electronic device of the exemplary embodiment viewed from the lower left of the shelf.

Referring to FIGS. 3 and 4, the shelf 100 includes a casing 105 and a fan 160. The casing 105 has a rectangular cross section and includes a top plate 110, a bottom plate 120, a left side plate 130, a right side plate 140, and a back plate 150. The back plate 150 is provided on a rear 102 side of the shelf 100. Note that the back plate is also referred to as a backboard or a back panel. The fan 160 is attached on the outer side of the left side plate 130. The mounting brackets 171 that attach the shelf 100 to the rack 2 are provided on the outer side of the fan 160 and at a portion on a front 101 side of the shelf 100 and are provided on the outer side of the right side plate 140 and at a portion on a front 101 side of the shelf 100. The holes 172 are provided in the mounting brackets 171.

Figure 5A:
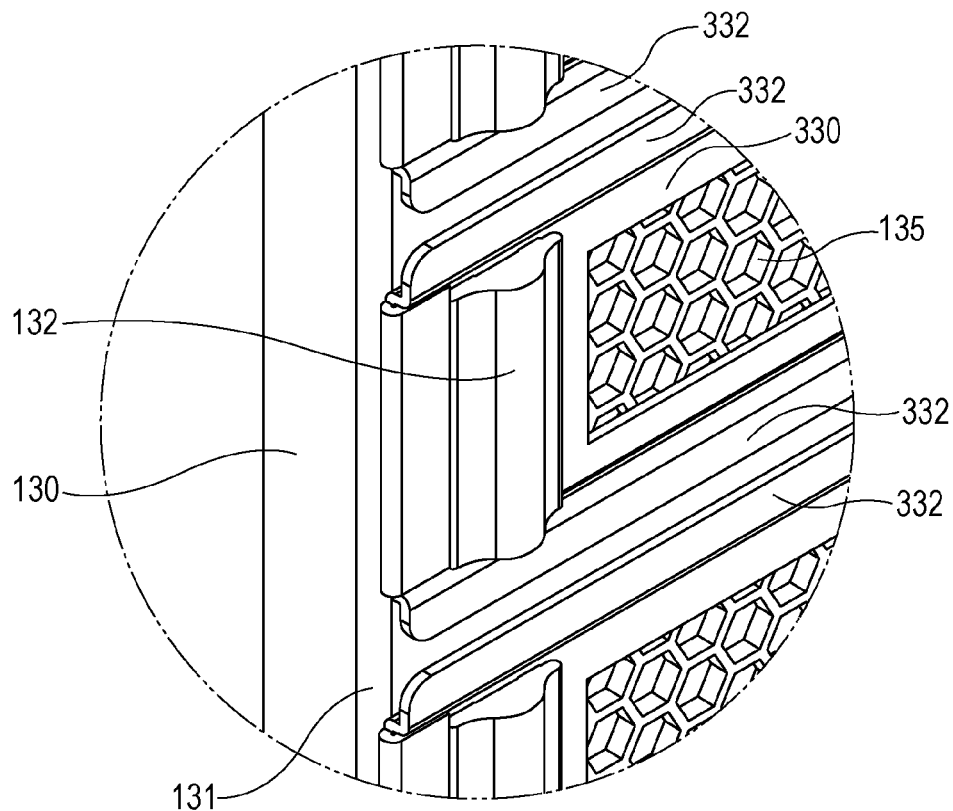
FIG. 5A is a schematic enlarged view of a portion VA of FIG. 3.
Figure 7:
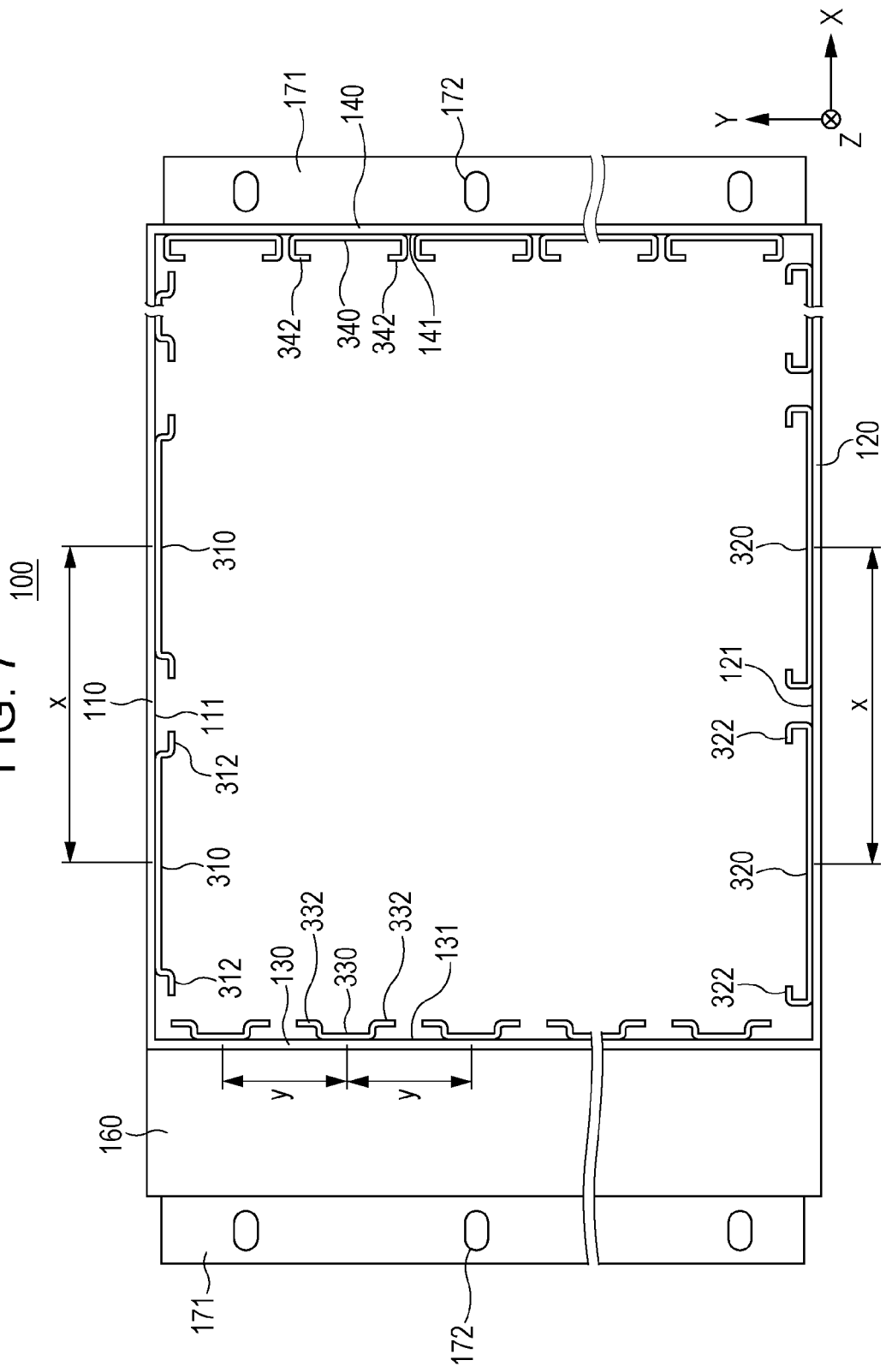
FIG. 7 is a schematic front view of the shelf of the plug-in electronic device of the exemplary embodiment in which illustration of a back plate, or a backboard, is omitted.

Referring to FIGS. 3, 5A, and 7, rails 330 are attached on an inner wall 131 of the left side plate 130 of the shelf 100 at a predetermined interval y. The rails 330 are provided so as to extend from the front 101 side to the rear 102 side of the shelf 100. A guide portion 332 is provided at each of the upper and lower portions of each rail 330. The guide portions 332 are provided so as to extend from the front 101 side to the rear 102 side of the shelf 100. A shield gasket 132 is provided between the guide portions 332 of each rail 330 at a portion on the front 101 side. An electrically conductive material, such as a conductive cloth, is used for the shield gasket 132. Ventilation holes 135 are provided between the guide portions 332 of each rail 330 on the rear 102 side with respect to the shield gasket 132.

Figure 5B:
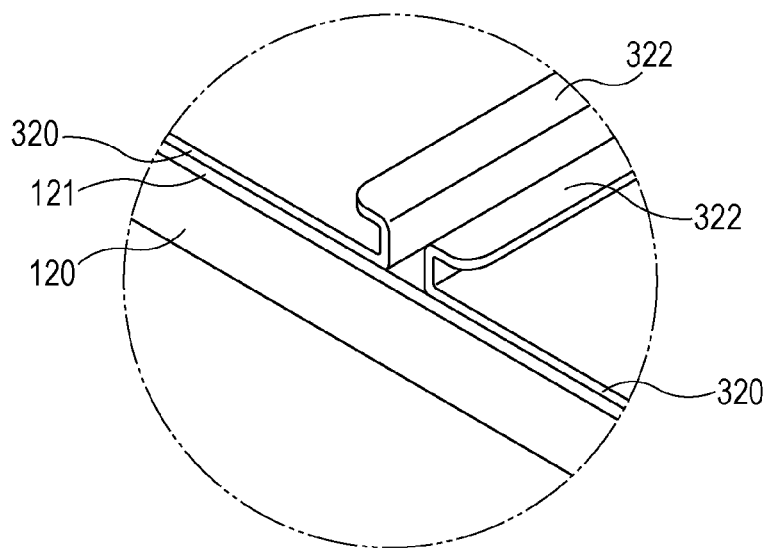
FIG. 5B is a schematic enlarged view of a portion VB of FIG. 3.

Referring to FIGS. 3, 5B, and 7, rails 320 are attached on an inner wall 121 of the bottom plate 120 of the shelf 100 at a predetermined interval x. The rails 320 are provided so as to extend from the front 101 side to the rear 102 side of the shelf 100. A guide portion 322 is provided at each of the left and right portions of each rail 320. The guide portions 322 are provided so as to extend from the front 101 side to the rear 102 side of the shelf 100.

Figure 6A:
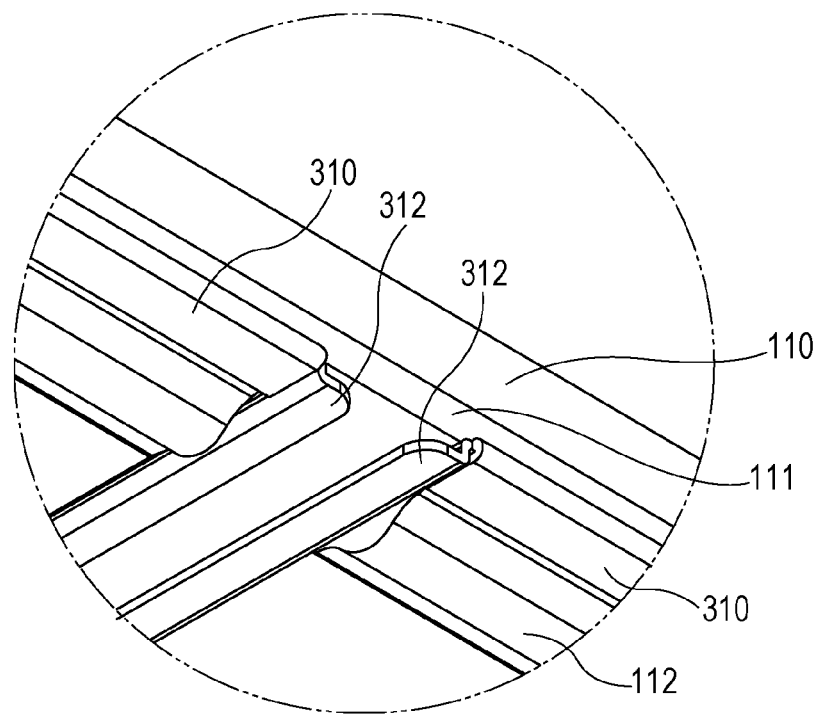
FIG. 6A is a schematic enlarged view of a portion VIA of FIG. 4.
Figure 6B:
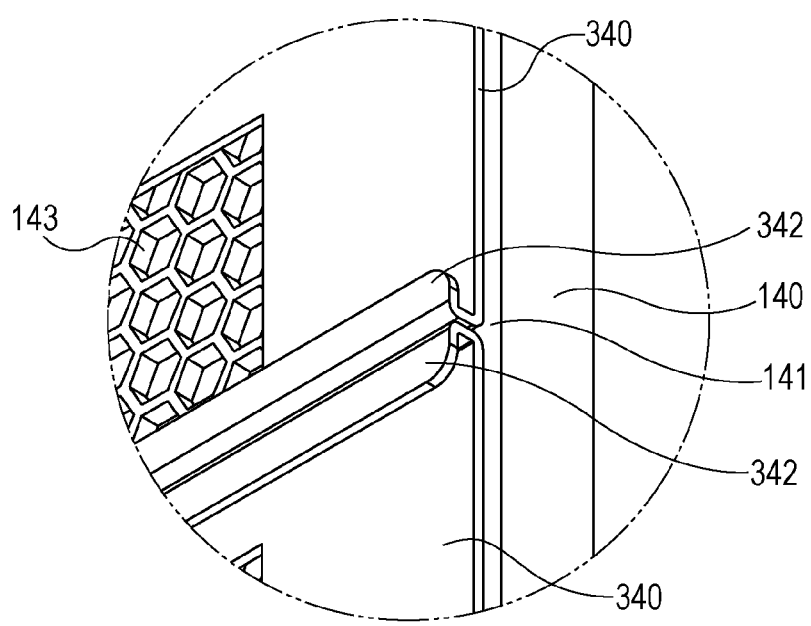
FIG. 6B is a schematic enlarged view of a portion VIB of FIG. 4.

Referring to FIGS. 4, 6A, and 7, rails 310 are attached on an inner wall 111 of the top plate 110 of the shelf 100 at a predetermined interval x. The predetermined interval x at which the rails 310 are attached is the same as the predetermined interval x at which the rails 320 are attached. Each rail 310 is arranged so as to oppose a corresponding rail 320. The rails 310 are provided so as to extend from the front 101 side to the rear 102 side of the shelf 100. A guide portion 312 is provided at each of the left and right portions of each rail 310. The guide portions 312 are provided so as to extend from the front 101 side to the rear 102 side of the shelf 100. A shield gasket 112 is provided between the guide portions 312 of each rail 310 at a portion on the front 101 side. An electrically conductive material, such as a conductive cloth, is used for the shield gasket 112.

Referring to FIGS. 3, 4, 6B, and 7, rails 340 are attached on an inner wall 141 of the right side plate 140 of the shelf 100 at a predetermined interval y. The predetermined interval y at which the rails 340 are attached is the same as the predetermined interval y at which the rails 330 are attached. The rails 340 are provided so as to extend from the front 101 side to the rear 102 side of the shelf 100. A guide portion 342 is provided at each of the upper and lower portions of each rail 340. The guide portions 342 are provided so as to extend from the front 101 side to the rear 102 side of the shelf 100. Ventilation holes 145 are provided between the guide portions 332 of each rail 340.

Referring to FIGS. 3 and 4, fit connectors 152 that are mated with fit connectors of the printed board units 200 described later and guide pins 154 that match the positions of the printed board units 200 when the printed board units 200 are fitted are provided on an inner wall 151 of the back plate 150 of the shelf 100.

Figure 10A:
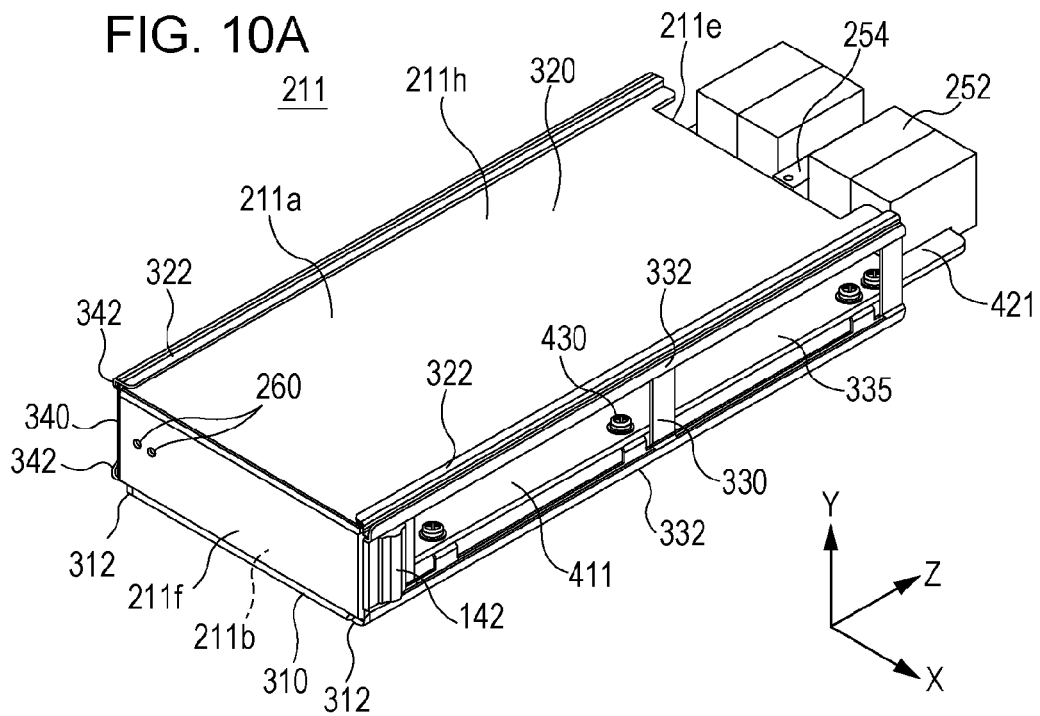
FIG. 10A is a schematic perspective view of the h×w-sized printed board unit of the plug-in electronic device of the exemplary embodiment viewed from the upper right.
Figure 10B:
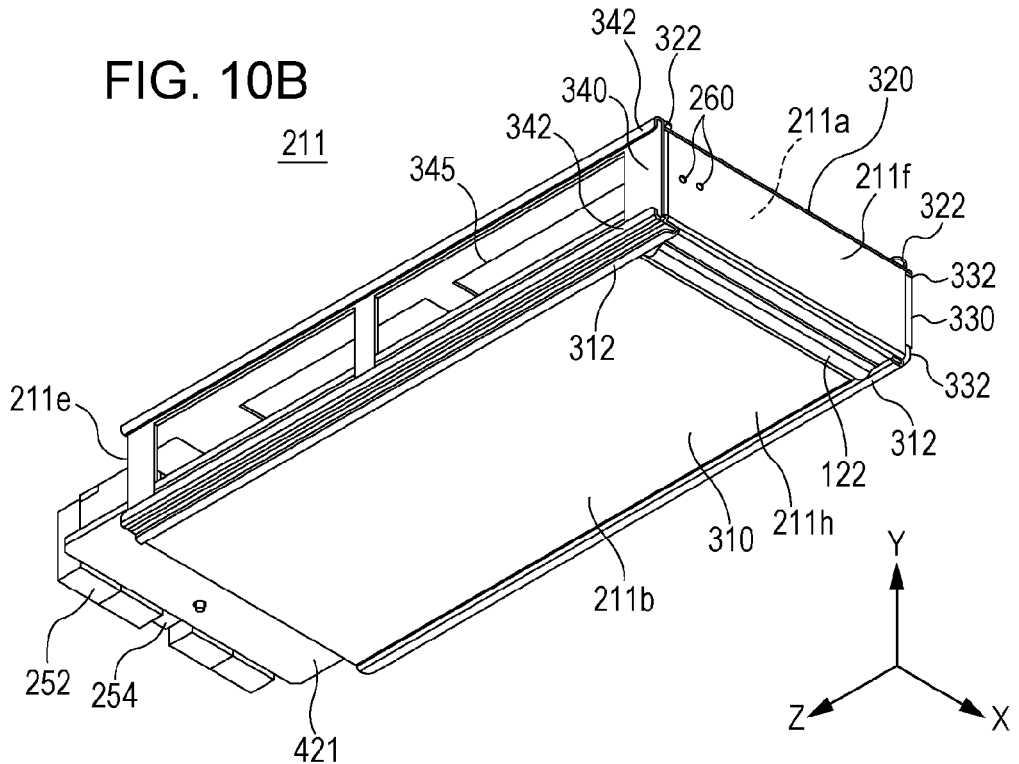
FIG. 10B is a schematic perspective view of the h×w-sized printed board unit of the plug-in electronic device of the exemplary embodiment viewed from the lower left.

Referring to FIGS. 8A, 10A, and 10B, the h×w-sized printed board unit 211 includes a casing 211h and a printed board 411. The casing 211h has a rectangular cross section and includes a top plate 211a, a bottom plate 211b, a left side plate 211c, a right side plate 211d, and a front plate 211f. Note that the printed board unit 211 exemplified in FIGS. 10A and 1013 does not have the left side plate and the right side plate of the casing 211h. A rear side 211e of the casing 211h is open. The printed board 411 is provided with circuits such as an electronic circuit and a circuit for an optical module. Holes 260 for indicator lamps that indicate the operation state and the like of the circuits are open in the front plate 211f.

A rail 320 is attached to the top plate 211a. A rail 310 is attached to the bottom plate 211b. A rail 340 is attached to the left side plate 211c. A rail 330 is attached to the right side plate 211d. The rails 310, 320, 330, and 340 are provided so as to extend from the front plate 211f side to the rear side 211e of the casing 211h.

The guide portions 332 are provided at the upper and lower portions of the rail 330. The guide portions 332 are each provided so as to extend from the front plate 211f side to the rear side 211e of the casing 211h. A shield gasket 142 is provided between the guide portions 332 of the rail 330 at a portion on the front plate 211f side. An electrically conductive material, such as a conductive cloth, is used for the shield gasket 142. Openings 335 are provided between the guide portions 332 of the rail 330 on the rear side with respect to the shield gasket 142.

The guide portions 342 are provided at the upper and lower portions of the rail 340. The guide portions 342 are each provided so as to extend from the front plate 211f side to the rear side 211e of the casing 211h. Openings 345 are provided between the guide portions 342 of the rail 340.

The guide portions 312 are provided at the left and right portions of the rail 310. The guide portions 312 are each provided so as to extend from the front plate 211f side to the rear side 211e of the casing 211h. A shield gasket 122 is provided between the guide portions 312 of the rail 310 at a portion on the front plate 211f side. An electrically conductive material, such as a conductive cloth, is used for the shield gasket 122.

The guide portions 322 are provided at the left and right portions of the rail 320. The guide portions 322 are each provided so as to extend from the front plate 211f side to the rear side 211e of the casing 211h.

The rails 310 and 330 of the printed board unit 211 have a hat shape that is the same as the shapes of the rails 310 and 330 of the shelf 100. Furthermore, the rails 320 and 340 of the printed board unit 211 have a shape that is the same as the shapes of the rails 320 and 340 of the shelf 100. The guide portions 322 and 342 at the two ends of each of the rails 320 and 340 of the printed board unit 211 and the guide portions 322 and 342 at the two ends of each of the rails 320 and 340 of the shelf 100 each have a C-shaped cross section.

The printed board 411 is inserted into the casing 211h from the rear side 211e of the casing 211h, is built into the casing 211h, and is fixed to the casing 211h with screws 430.

Fit connectors 252 are provided at a rear side 421 of the printed board 411, and a guide module 254 is provided between the fit connectors 252. The fit connectors 152 (see FIGS. 3 and 4), which are provided on the inner wall 151 of the back plate 150 of the shelf 100, and the fit connectors 252 are mated with each other. The fit connectors 152 are inserted into the fit connectors 252 when the fit connectors 152 are mated with the fit connectors 252. By mating the fit connectors 152 and the fit connectors 252 with each other, the printed board unit 211 and the back plate 150 of the shelf 100 are electrically coupled to each other.

When the printed board unit 211 is attached to the shelf 100, a guide pin 154 (see FIGS. 3 and 4), which is provided on the inner wall 151 of the back plate 150 of the shelf 100, is engaged with the guide module 254. The guide pin 154 is inserted into the guide module 254 when the guide pin 154 is engaged with the guide module 254. The guide pin 154 and the guide module 254 are used to position the printed board unit 211 when the printed board unit 211 is attached to the back plate 150 of the shelf 100.

Figure 11A:
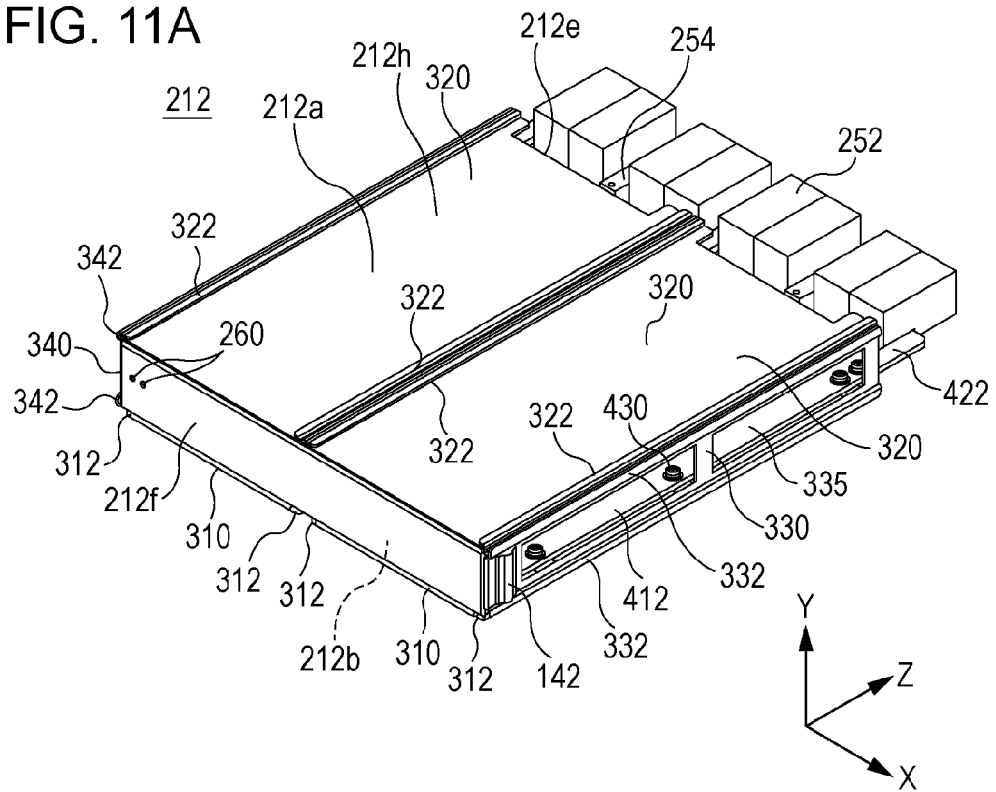
FIG. 11A is a schematic perspective view of the h×2w-sized printed board unit of the plug-in electronic device of the exemplary embodiment viewed from the upper right.
Figure 11B:
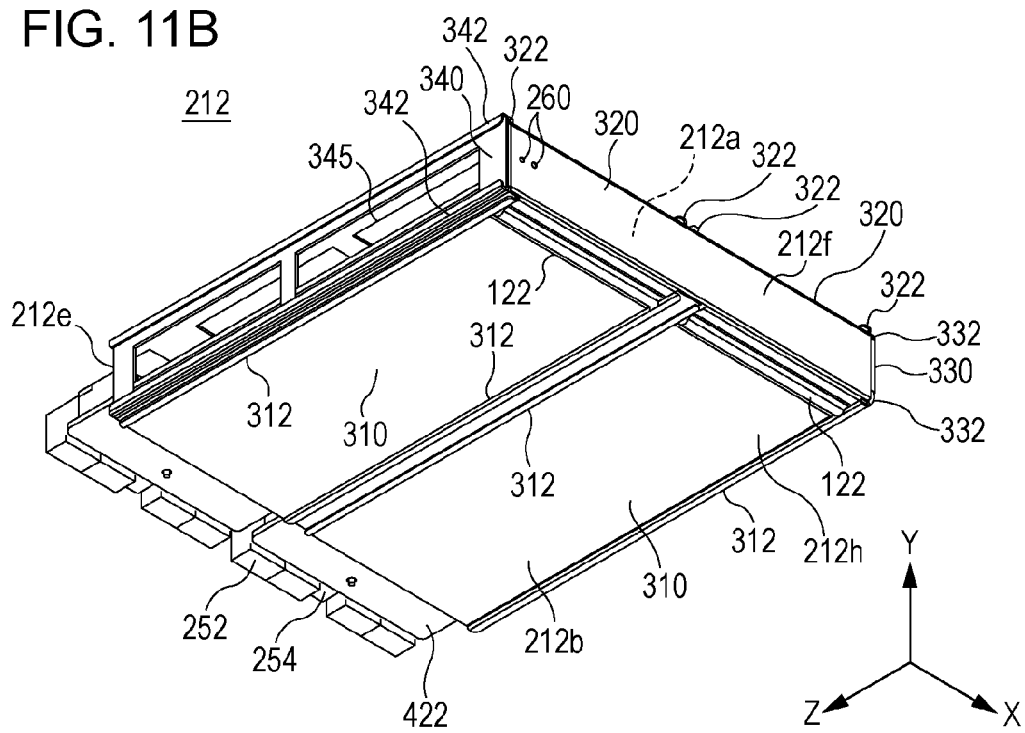
FIG. 11B is a schematic perspective view of the h×2w-sized printed board unit of the plug-in electronic device of the exemplary embodiment viewed from the lower left.

Referring to FIGS. 8B, 11A, and 11B, the h×2w-sized printed board unit 212 includes a casing 212h and a printed board 412. The casing 212h has a rectangular cross section and includes a top plate 212a, a bottom plate 212b, a left side plate 212c, a right side plate 212d, and a front plate 212f. Note that the printed board unit 212 exemplified in FIGS. 11A and 11B does not have the left side plate and the right side plate of the casing 211h. A rear side 212e of the casing 212h is open. The printed board 412 is provided with circuits such as an electronic circuit and a circuit for an optical module. Holes 260 for indicator lamps that indicate the operation state and the like of the circuits are provided in the front plate 212f.

Two rails 320 are attached to the top plate 212a. Two rails 310 are attached to the bottom plate 212b. The rails 320 are provided so as to oppose the rails 310. The interval at which the rails 320 are arranged and the interval at which the rails 310 are arranged are the same. The interval x at which the rails 310 and 320 of the printed board unit 212 are attached is the same as the regular interval x at which the rails 310 and 320 of the shelf 100 are attached. A rail 340 is attached to the left side plate 212c. A rail 330 is attached to the right side plate 212d. The rails 310 and 330 of the printed board unit 212 have a hat shape that is the same as the shapes of the rails 310 and 330 of the shelf 100. Furthermore, the rails 320 and 340 of the printed board unit 212 and the rails 320 and 340 of the shelf 100 all have a channel shape. The guide portions 322 and 342 at the two ends of each of the rails 320 and 340 of the printed board unit 212 and the guide portions 322 and 342 at the two ends of each of the rails 320 and 340 of the shelf 100 have a C-shaped cross section.

A shield gasket 142 is provided between the guide portions 332 of the rail 330 at a portion on the front plate 212f side. Openings 335 are provided between the guide portions 332 of the rail 330 on the rear side with respect to the shield gasket 142. A shield gasket 122 is provided between the guide portions 312 of each rail 310 at a portion on the front plate 212f side. An electrically conductive material, such as a conductive cloth, is used for the shield gaskets 142 and 122.

The printed board 412 is inserted into the casing 212h from the rear side 212e of the casing 212h, is built into the casing 212h, and is fixed to the casing 212h with screws 430.

The fit connectors 252 are provided at a rear side 422 of the printed board 412, and the guide modules 254 are provided between the fit connectors 252. The fit connectors 252 and the guide modules 254 that are provided in the printed board 412 are the same as the fit connectors 252 and the guide module 254 that are provided in the printed board 411. The fit connectors 252 are mated with the fit connectors 152 (see FIGS. 3 and 4). By mating the fit connectors 152 and the fit connectors 252 with each other, the printed board unit 212 and the back plate 150 of the shelf 100 are electrically coupled to each other. The guide modules 254 are engaged with the guide pins 154 (see FIGS. 3 and 4). The guide pins 154 and the guide modules 254 are used to position the printed board unit 212 when the printed board unit 212 and the back plate 150 of the shelf 100 are electrically coupled to each other.

Figure 9:
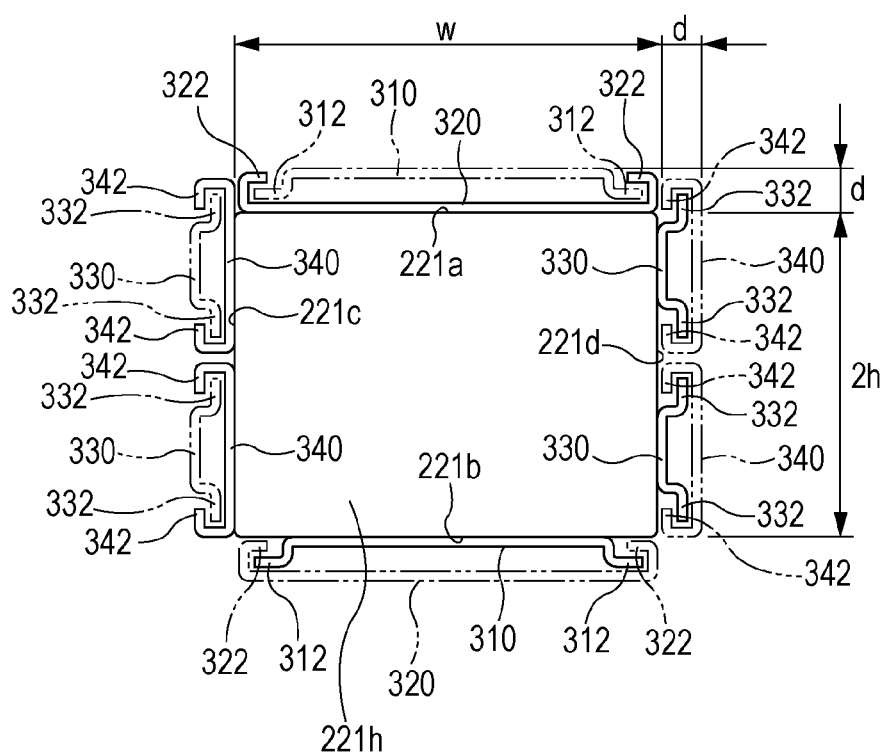
FIG. 9 is a schematic front view of a 2h×w-sized printed board unit of the plug-in electronic device of the exemplary embodiment.

Referring to FIG. 9, the 2h×w-sized printed board unit 221 includes a casing 221h and a printed board. The casing 221h has a rectangular cross section and includes a top plate 221a, a bottom plate 221b, a left side plate 221c, a right side plate 221d, and a front plate. The rear side of the casing 221h is open.

The rail 320 is attached to the top plate 221a. The rail 310 is attached to the bottom plate 221b. The rail 320 is provided so as to oppose the rail 310. Two rails 340 are attached to the left side plate 221c. Two rails 330 are attached to the right side plate 221d. The interval at which the rails 330 are arranged and the interval at which the rails 340 are arranged are the same. The interval y at which the rails 330 and 340 of the printed board unit 221 are attached is the same as the regular interval y at which the rails 330 and 340 of the shelf 100 are attached.

The description of the printed board units 200 has been given above while the h×w-sized printed board unit 211, the h×2w-sized printed board unit 212, and the 2h×w-sized printed board unit 221 are given as an example. The printed board units 200 with other sizes, such as the 2h×2w-sized printed board unit 222 and the h×4w-sized printed board unit 214, have a similar structure.

Figure 12:
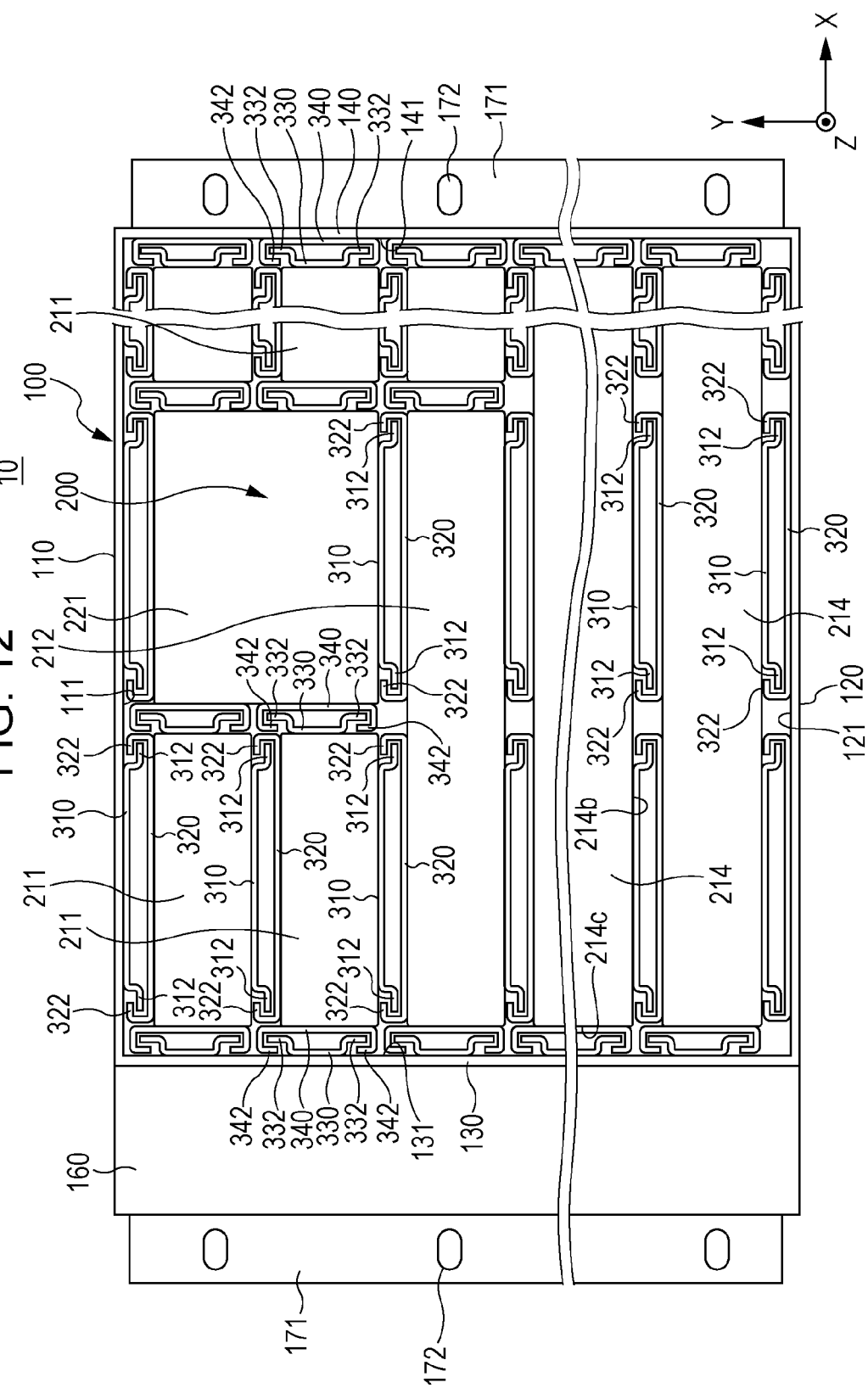
FIG. 12 is a schematic front view of the shelf of the plug-in electronic devices of the exemplary embodiment in which the plug-in electronic devices are mounted.

Referring to FIG. 12, a plurality of printed board units 200, more specifically, different types of printed board units 211, 212, 221, 214, and the like with different sizes are mounted inside the casing 105 of the shelf 100. When the printed board units 200 are mounted inside the casing 105, the rear side of each of the printed board units 200 that is provided with the fit connectors 252 and one or more guide modules 254 is inserted into the casing 105 from the front 101 side first.

The printed board units 200 are mounted in the casing 105 of the shelf 100 in the following manner.

First, one h×w-sized printed board unit 211 (an h×w-sized printed board unit 211-1) is mounted in the uppermost row of the leftmost column of the casing 105, for example. When the printed board unit 211-1 is mounted, the rail 320 attached to the top plate 211a of the printed board unit 211 is engaged with the rail 310 attached to the inner wall 111 of the top plate 110 of the shelf 100. Furthermore, the rail 340 attached to the left side plate 211c of the printed board unit 211 is engaged with the rail 330 attached to the left side plate 130 of the shelf 100.

Then, another h×w-sized printed board unit 211 (an h×w-sized printed board unit 211-2) is mounted directly under the h×w-sized printed board unit 211 (the h×w-sized printed board unit 211-1) that has been mounted in the uppermost row of the leftmost column, for example. When the printed board unit 211 (the printed board unit 211-2) is mounted, the rail 310 attached to the bottom plate 211b of the printed board unit 211-1 is engaged with the rail 320 attached to the top plate 211a of the printed board unit 211-2. Furthermore, the rail 340 attached to the left side plate 211c of the printed board unit 211 (the printed board unit 211-2) is engaged with the rail 330 attached to the inner wall 131 of the left side plate 130 of the shelf 100.

Then, for example, the 2h×w-sized printed board unit 221 is mounted on the right side of the printed board unit 211 (the printed board unit 211-1) and the printed board unit 211 (the printed board unit 211-2). When the printed board unit 221 is mounted, the rail 320 attached to the top plate 221a of the printed board unit 221 is engaged with the rail 310 attached to the inner wall 111 of the top plate 110 of the shelf 100. Furthermore, the rail 340 attached to the upper portion of the left side plate 221c of the printed board unit 221 is engaged with the rail 330 attached to the right side plate 211d of the printed board unit 211 (the printed board unit 211-1). Furthermore, the rail 340 attached to the lower portion of the left side plate 221c of the printed board unit 221 is engaged with the rail 330 attached to the right side plate 211d of the printed board unit 211 (the printed board unit 211-2).

Figure 15:
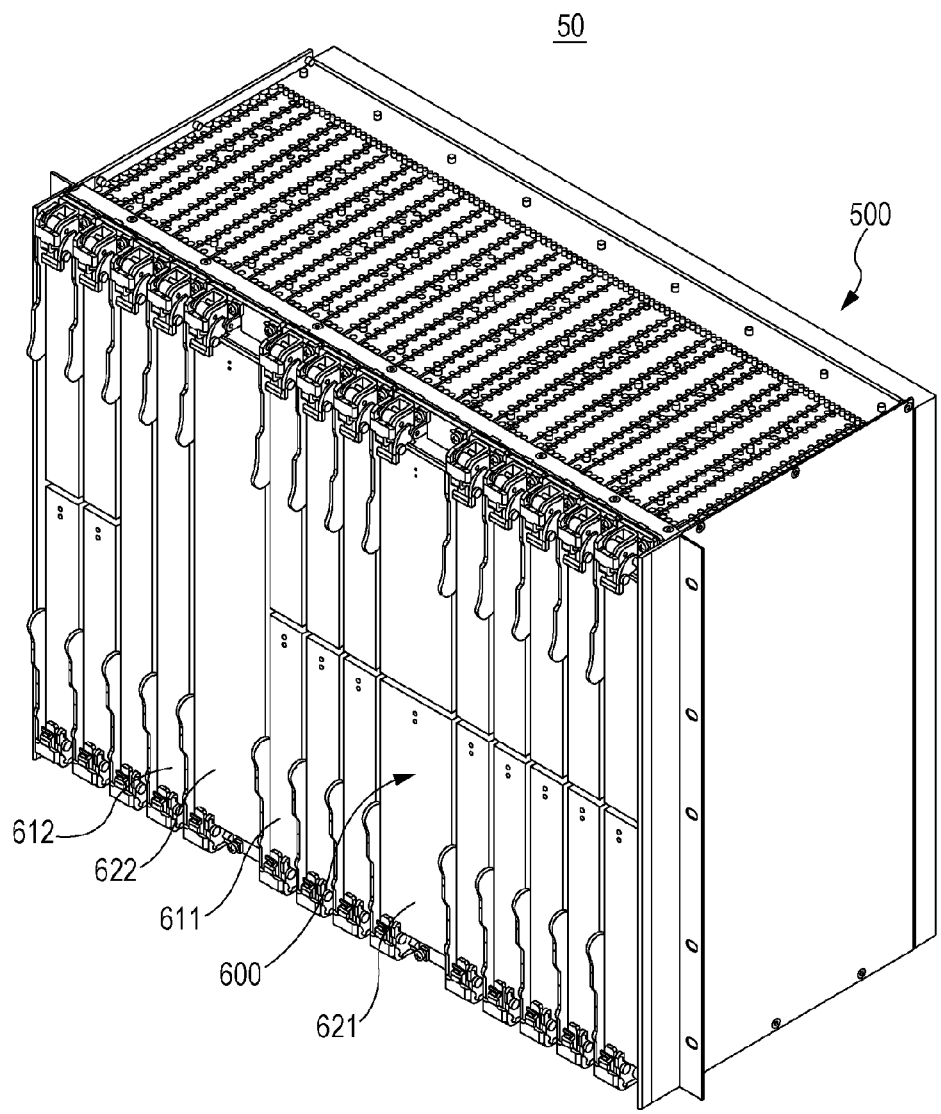
FIG. 15 is a schematic perspective view for illustrating a comparative example of the plug-in electronic device.
Figure 16:
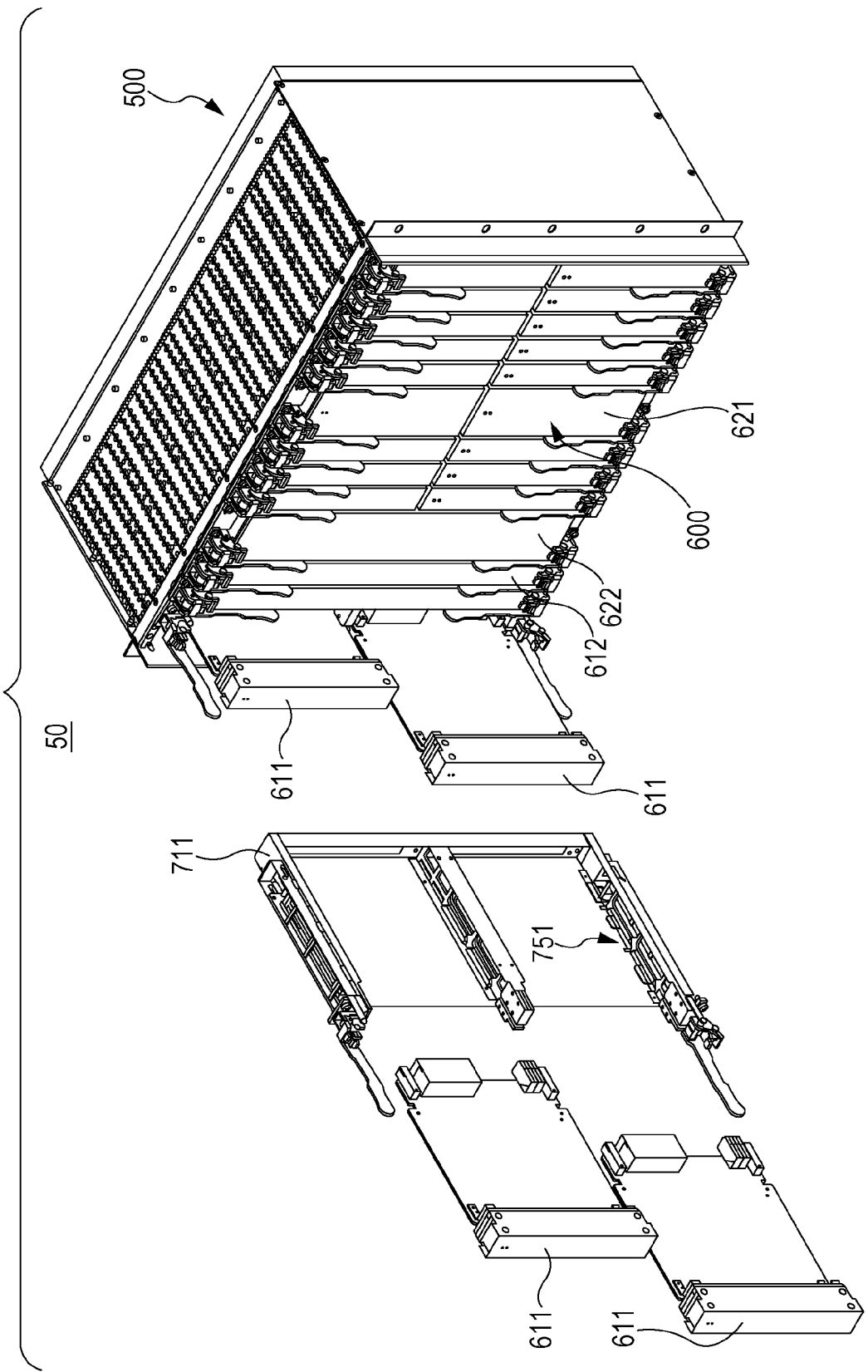
FIG. 16 is a schematic perspective view for illustrating a comparative example of the plug-in electronic device.

Now, a plug-in device 50 that is a comparative example illustrated in FIGS. 15 and 16 will be described. In the plug-in device 50, mount frames 711 are attached to a shelf 500 in advance. Guide rails 751 are disposed in each mount frame 711. The guide rails 751 are used to mount printed board units 600 in the two upper and lower sections of the mount frame 711. The printed board units 600 are provided in a variety of sizes in accordance with the circuit scale. For example, there are printed board units 611 whose size is the reference size and printed board units 621 whose width is twice the width of the reference size. There are other variations in the size of the printed board units 600 other than the above printed board units 600, such as a printed board unit 612 whose height is twice the height of the reference size and a printed board unit 622 whose width and height is twice the width and height of the reference size.

Furthermore, since mount frames that correspond to the size of the printed board units 600 are provided so as to mount the printed board units 600 in the plug-in device 50, when a printed board unit 600 with a different size is to be mounted in the plug-in device 50, the initially mounted printed board unit 600 is removed from the shelf 500, then, the mount frame is removed from the shelf 500, and a different mount frame is attached to the shelf 500. Then, a different printed board unit 600 is mounted in the shelf 500.

In contrast, in the technique disclosed in the present application, no mount frames described above that correspond to the size of the printed board units 200 are called for and the printed board units 200 may be mounted in the shelf 100 by directly engaging the printed board units 200 with the rails 310, 320, 330, and 340 of the shelf 100. Furthermore, each printed board unit 200 may be mounted in the shelf 100 by engaging a rail of the printed board unit 200 with a rail of an adjacent printed board unit.

Note that the printed board unit 200 is mounted on the inner wall 121 of the bottom plate 120 of the shelf 100 in the following manner. An example of mounting the h×4w-sized printed board unit 214 is given. The four rails 310 that are attached to the bottom plate 214b of the printed board unit 214 are engaged with the four rails 320 that are attached to the inner wall 121 of the bottom plate 120 of the shelf 100. Note that, as illustrated in FIG. 12, when the printed board unit 214 is mounted in the leftmost column, the rail 340 that is attached to the left side plate 214c of the printed board unit 214 is engaged with the rail 330 that is attached to the inner wall 131 of the left side plate 130 of the shelf 100.

Furthermore, the printed board unit 200 is mounted to the inner wall 141 of the right side plate 140 of the shelf 100 in the following manner. Here, an h×w-sized printed board unit 211 (an h×w-sized printed board unit 211-3) is mounted in the second top row of the rightmost column as an example. The rail 330 attached to the right side plate 211d of the printed board unit 211 (the printed board unit 211-3) is engaged with the rail 340 attached to the inner wall 141 of the right side plate 140 of the shelf 100.

The printed board units 200 are mounted in the shelf 100, in which no printed board unit 200 is mounted, with the following procedure. First, a printed board unit 200 is mounted on any one or, when the printed board unit 200 is mounted in the corner, any two of the inner wall 111 of the top plate 110, the inner wall 121 of the bottom plate 120, the inner wall 131 of the left side plate 130, and the inner wall 141 of the right side plate 140 of the shelf 100. Then, another printed board unit 200 is mounted so that the another printed board unit 200 is in contact with at least one of the top plate, the bottom plate, the right side plate, and left side plate of the already mounted printed board unit 200 and the inner walls 111, 121, 131, and 141 of the shelf 100. Hereinafter, other printed board units 200 are mounted in the shelf 100 in a similar manner.

As described above, the printed board units 200 are mounted in the shelf 100 without creating any vacant space in the shelf 100. Each rail of all the mounted printed board units 200 is engaged with the upper, lower, left, or right rail of its neighboring printed board unit 200 or with the upper, lower, left, or right rail of the shelf 100. In other words, a rail 320 that is attached to the top plate of one printed board unit 200 is engaged with the rail 310 that is attached to the bottom plate of another printed board unit 200 that is adjacent to the upper side of the one printed board unit 200 or is engaged with a rail 310 that is attached to the inner wall 111 of the top plate 110 of the shelf 100 that is adjacent to the upper side of the one printed board unit 200. The rail 310 that is attached to the bottom plate of the one printed board unit 200 is engaged with the rail 320 that is attached to the top plate of still another printed board unit 200 that is adjacent to the bottom side of the one printed board unit 200 or is engaged with the rail 320 of the inner wall 121 of the bottom plate 120 of the shelf 100 that is adjacent to the bottom side of the one printed board unit 200. The rail 330 that is attached to the right side plate of the one printed board unit 200 is engaged with the rail 340 that is attached to the left side plate of yet another printed board unit 200 that is adjacent to the right side of the one printed board unit 200 or is engaged with the rail 340 that is attached to the inner wall 141 of the right side plate 140 of the shelf 100 that is adjacent to the right side of the one printed board unit 200. The rail 340 that is attached to the left side plate of the one printed board unit 200 is engaged with the rail 330 that is attached to the right side plate of still yet another printed board unit 200 that is adjacent to the left side of the one printed board unit 200 or is engaged with the rail 330 that is attached to the inner wall 131 of the left side plate 130 of the shelf 100 that is adjacent to the left side of the one printed board unit 200. As described above, each printed board unit 200 is guided to its position and is maintained at its position by being engaged with the upper, lower, left, and right rails of its neighboring printed board units 200 or with the upper, lower, left, and right rails of its neighboring shelf 100.

Regardless of the size of each printed board unit 200, each of the rails 310, 320, 330, and 340 of each printed board unit 200 are the same as the other corresponding rails 310, 320, 330, 340 of the other printed board units 200. The rails 310, 320, 330, and 340 of each printed board unit 200 are the same as the rails 310, 320, 330, and 340 of the shelf 100, respectively. The rails 310 and the rails 320 are engaged with each other and the rails 330 and the rails 340 are engaged with each other.

Referring to FIG. 12, when a rail 310 and a rail 320 are engaged with each other, the guide portions 312 of the rail 310 are inserted into the guide portions 322 of the rail 320. When a rail 330 and a rail 340 are engaged with each other, the guide portions 332 of the rail 330 are inserted into the guide portions 342 of the rail 340.

Referring to FIGS. 8A and 8B, the regular interval x at which the rails 310 are attached and the regular interval x at which the rails 320 are attached are equivalent to the sum of the reference width w of the printed board unit 200 and an engagement margin d of the rail 330 and the rail 340. Furthermore, the regular interval y at which the rails 330 are attached and the regular interval y at which the rails 340 are attached are equivalent to the sum of the reference height h of the printed board unit 200 and an engagement margin d of the rail 310 and the rail 320. The reference width w is the distance between the left side plate 211$c$ and the right side plate 211$d$. The reference height h is the distance between the top plate 211$a$ and the bottom plate 211$b$ of the printed board unit 211.

Note that there are cases in which the printed board units 200 do not have to be mounted in the shelf 100 such that the shelf 100 is fully filled with the printed board units 200 in order to achieve the function of the plug-in electronic device 10. In such a case, the portion where the printed board unit 200 is not mounted is not left as a vacant space but, in place of the printed board unit 200, a filler unit (a dummy unit) that has the same size as that of the printed board unit 200 is mounted. A description of an exemplary filler unit will be given with reference to FIGS. 13A and 13B. Referring to FIGS. 13A and 13B, an h×w-sized filler unit 291 is different from the printed board unit 211 in that the printed board 411 is not provided in the h×w-sized filler unit 291 and that there are no holes 260 for the indicator lamps provided in the front plate 211$f$. Other than the above, the h×w-sized filler unit 291 is the same as the printed board unit 211. The same applies for other filler units with different sizes such as an h×2w-sized filler unit, a 2h×w-sized filler unit, and a 2h×2w-sized filler unit.

Figure 14:
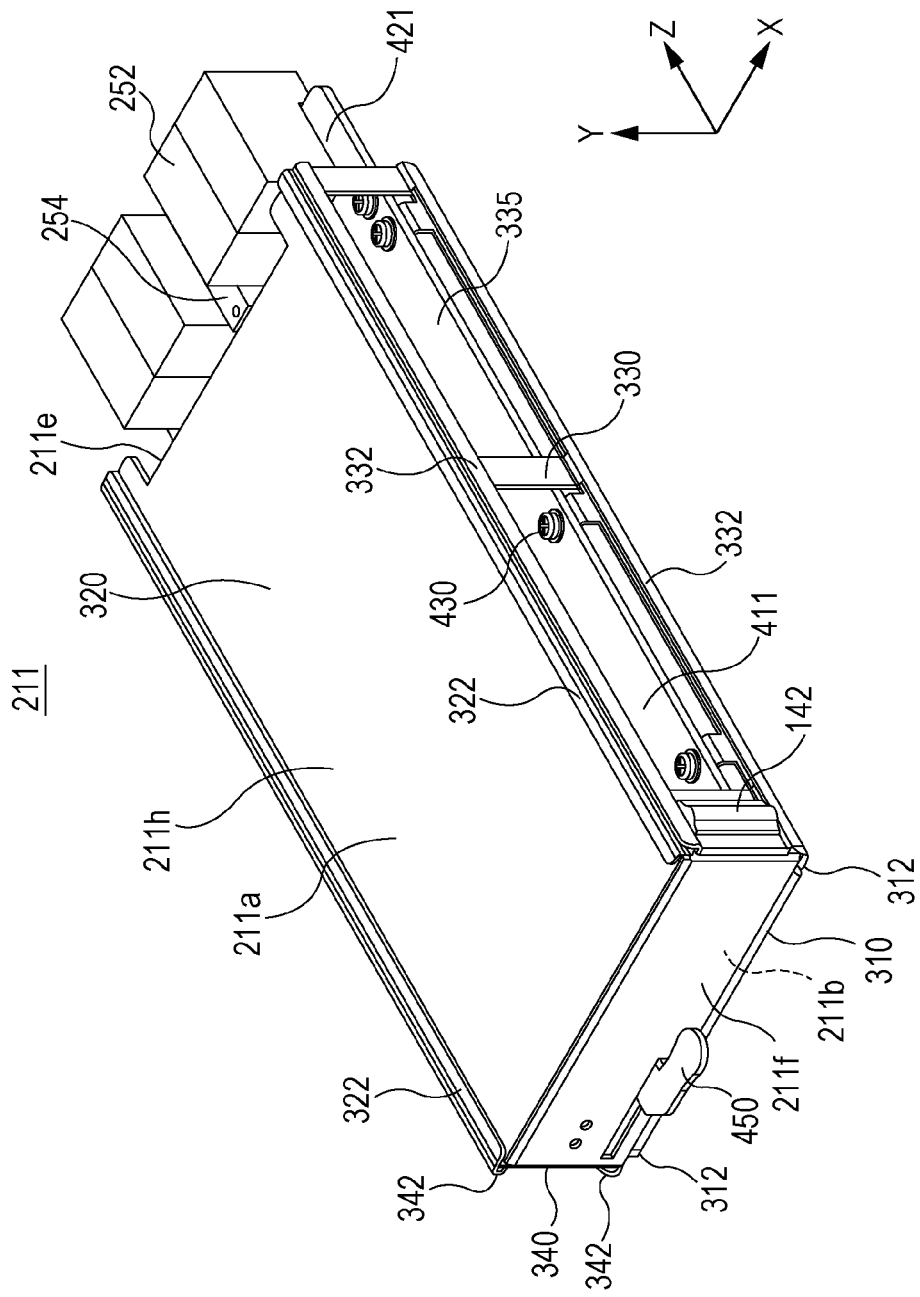
FIG. 14 is a schematic perspective view of a modification of the h×w-sized printed board unit of the plug-in electronic device of the exemplary embodiment viewed from the upper right.

Furthermore, the printed board unit 200 may employ a card lever 450 (see FIG. 14) in order to insert and remove the printed board unit 200 in a stable manner.

Moreover, as illustrated in FIG. 2, when each of the printed board units 200 are mounted in the shelf 100, the openings 335 and 334 that are formed in the printed board units 211, 212, 222, and 214, for example, are in communication with each other in the width direction (see FIGS. 10A, 10B, 11A, and 11B). Accordingly, a ventilation passage is formed in the width direction between the ventilation holes 135 and the ventilation holes 145 of the shelf 100 (see FIG. 3). Note that since the air sent from the fan 160 through the ventilation holes 135 passes through the ventilation passage to the ventilation holes 145, all of the printed board units 200 that are mounted in the shelf 100 may be cooled.

Furthermore, when the printed board units 200 are mounted in the shelf 100, the shield gaskets 122 and 142 formed in each of the printed board units 200 adhere to the shelf 100. Similarly, the shield gaskets 112 and 132 formed in the shelf 100 adhere to the printed board units 200. Accordingly, the printed board units 200 and the shelf 100 are in communication with each other. Accordingly, wave leakage from electronic circuits and the like can be suppressed. Furthermore, antistatic performance may be improved.

While an exemplary embodiment of the technique disclosed in the present application has been described above, the technique disclosed in the present application is not limited to the exemplary embodiment described above. Furthermore, the exemplary embodiment and the variety of modifications described above may be appropriately combined. It goes without saying that the technique disclosed in the present application may be embodied in a variety of aspects without departing from the spirit and scope of the technique disclosed in the present application.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. An electronic device, comprising:
a frame body that has a rectangular cross section, the frame body including
first and second inner walls that oppose each other,
third and fourth inner walls that oppose each other and that intersect with the first and second inner walls,
a plurality of first engagement members that are arranged on the first inner wall at a first interval,
a plurality of second engagement members that are arranged on the second inner wall at the first interval so as to oppose the first engagement members, the second engagement members each having a structure that allows each of the second engagement members to be engaged with a corresponding first engagement member of the first engagement members,
a plurality of third engagement members arranged on the third inner wall at a second interval, and
a plurality of fourth engagement members that are arranged on the fourth inner wall at the second interval so as to oppose the third engagement members, the fourth engagement members each having a structure that allows each of the fourth engagement members to be engaged with a corresponding third engagement member of the third engagement members; and
two or more electronic device units that each have a rectangular cross section, the two or more electronic device units each including
first and second sides that oppose each other,
third and fourth sides that oppose each other and that intersect with the first and second sides, a single second engagement member or two or more second engagement members provided on an outer side of the first side, the two or more second engagement members arranged at the first interval, a single first engagement member or two or more first engagement members provided on an outer side of the second side, the two or more first engagement members arranged at the first interval, a single fourth engagement member or two or more fourth engagement members provided on an outer side of the third side, the two or more fourth engagement members arranged at the second interval, and a single third engagement member or two or more third engagement members provided on an outer side of the fourth side, the two or more third engagement members arranged at the second interval.

2. The electronic device according to claim 1, wherein dimensions of at least either one of the first side and the third side of the electronic device units are different from each other.

3. The electronic device according to claim 1, further comprising a dummy unit that has a rectangular cross section and that includes the first and second sides that oppose each other, the third and fourth sides that oppose each other and that intersect with the first and second sides, the single second engagement member or the two or more second engagement members provided on the outer side of the first side, the two or more second engagement members arranged at the first interval, the single first engagement member or the two or more first engagement members provided on the outer side of the second side, the two or more first engagement members arranged at the first interval, the single fourth engagement member or the two or more fourth engagement members provided on the outer side of the third side, the two or more fourth engagement members arranged at the second interval, and the single third engagement member or the two or more third engagement members provided on the outer side of the fourth side, the two or more third engagement members arranged at the second interval.

4. The electronic device according to claim 1, wherein a length of the first interval is equivalent to a width of the electronic device unit added to an engagement margin of a third engagement member of the third engagement members and a corresponding fourth engagement member of the fourth engagement members, and a length of the second interval is equivalent to a height of the electronic device unit added to a height of an engagement margin of a first engagement member of the first engagement members and a corresponding second engagement member of the second engagement members.

5. The electronic device according to claim 1, wherein the second engagement members and the fourth engagement members are each a guide rail that includes a pair of guide portions that have a C-shaped cross section at both ends of the guide rail, and the first engagement members and the third engagement members are each a hat-shaped insertion rail that is engaged into the pair of guide portions of the guide rail.

6. The electronic device according to claim 1, wherein openings are formed in the first and second sides, and a ventilation passage that is in communication with the openings is formed in a width direction of each electronic device unit when each electronic device unit is mounted in the frame body.

7. The electronic device according to claim 1, wherein the frame body includes a conductive member, and the electronic device units each include a conduction member that allows the electronic device units to be in communication with the frame body when the electronic device units are mounted in the frame body.

8. An electronic device unit that has a rectangular cross section, the electronic device mounted in a frame body that has a rectangular cross section in which the frame body includes first and second inner walls that oppose each other, third and fourth inner walls that oppose each other and that intersect with the first and second inner walls, a plurality of first engagement members that are arranged on the first inner wall at a first interval, a plurality of second engagement members that are arranged on the second inner wall at the first interval so as to oppose the first engagement members, the second engagement members each having a structure that allows each of the second engagement members to be engaged with a corresponding first engagement member of the first engagement members, a plurality of third engagement members arranged on the third inner wall at a second interval, and a plurality of fourth engagement members that are arranged on the fourth inner wall at the second interval so as to oppose the third engagement members, the fourth engagement members each having a structure that allows each of the fourth engagement members to be engaged with a corresponding third engagement member of the third engagement members, the electronic device unit comprising:

first and second sides that oppose each other;

third and fourth sides that oppose each other and that intersect with the first and second sides;

a single second engagement member or two or more second engagement members provided on an outer side of the first side, the two or more second engagement members arranged at the first interval;

a single first engagement member or two or more first engagement members provided on an outer side of the second side, the two or more first engagement members arranged at the first interval;

a single fourth engagement member or two or more fourth engagement members provided on an outer side of the third side, the two or more fourth engagement members arranged at the second interval; and a single third engagement member or two or more third engagement members provided on an outer side of the fourth side, the two or more third engagement members arranged at the second interval.

9. An electronic device unit that has a rectangular cross section, the electronic device unit comprising:

first and second sides that oppose each other;

third and fourth sides that oppose each other and that intersect with the first and second sides;

a single first engagement member or two or more first engagement members provided on an outer side of the first side, the two or more first engagement members arranged at a first interval;

a single second engagement member or two or more second engagement members provided on an outer side of the second side, the two or more second engagement members arranged at the first interval, the single second engagement member or the two or more second engagement members each having a structure that allows the single second engagement member or each of the two or more second engagement members to be engaged with a corresponding first engagement member of the first engagement members;

a single third engagement member or two or more third engagement members provided on an outer side of the third side, the two or more third engagement members arranged at a second interval; and a single fourth engagement member or two or more fourth engagement members provided on an outer side of the fourth side, the two or more fourth engagement members arranged at the second interval, the single fourth engagement member or the two or more fourth engagement members each having a structure that allows the single fourth engagement member or each of the two or more fourth engagement members to be engaged with a corresponding third engagement member of the third engagement members.

* * * * *